(12) United States Patent
Thompson et al.

(10) Patent No.: US 8,637,334 B2
(45) Date of Patent: Jan. 28, 2014

(54) HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION

(75) Inventors: Daniel B. Thompson, Walnut Creek, CA (US); Jacob J. Richardson, Santa Barbara, CA (US); Ingrid Koslow, Santa Barbara, CA (US); Jun Seok Ha, Goleta, CA (US); Frederick F. Lange, Santa Barbara, CA (US); Maryann E. Lange, legal representative, Santa Barbara, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 318 days.

(21) Appl. No.: 12/938,948

(22) Filed: Nov. 3, 2010

(65) Prior Publication Data

US 2011/0266551 A1    Nov. 3, 2011

Related U.S. Application Data

(60) Provisional application No. 61/257,812, filed on Nov. 3, 2009, provisional application No. 61/257,811, filed on Nov. 3, 2009, provisional application No. 61/257,814, filed on Nov. 3, 2009.

(51) Int. Cl.
  *H01L 33/00*   (2010.01)
(52) U.S. Cl.
  USPC ............. 438/29; 257/98; 257/103; 257/183; 257/E33.025; 257/E33.074; 438/46

(58) Field of Classification Search
  USPC ............... 257/183, E33.028, E33.067, 98, 257/E33.025; 438/29, 46
  See application file for complete search history.

(56) References Cited

U.S. PATENT DOCUMENTS

| | | | |
|---|---|---|---|
| 3,721,611 A | 3/1973 | Jones | |
| 6,458,673 B1 | 10/2002 | Cheung | |
| 7,265,037 B2 | 9/2007 | Yang et al. | |
| 7,767,140 B2 | 8/2010 | Min et al. | |
| 8,299,473 B1 * | 10/2012 | D'Evelyn et al. | 257/79 |
| 2003/0084838 A1 | 5/2003 | McCandlish et al. | |
| 2004/0089868 A1 | 5/2004 | Hon et al. | |
| 2004/0105810 A1 | 6/2004 | Ren et al. | |
| 2004/0265507 A1 | 12/2004 | Xiong et al. | |
| 2005/0009224 A1 | 1/2005 | Yang et al. | |
| 2005/0179051 A1 | 8/2005 | Kondoh et al. | |
| 2005/0179052 A1 | 8/2005 | Yi et al. | |
| 2006/0261323 A1 * | 11/2006 | Suh et al. | 257/13 |

(Continued)

OTHER PUBLICATIONS

An, S. et al., "Enchanted light output of GaN-based light-emitting diodes with ZnO nanorod arrays," Applied Physics Letters 92, 121108 (2008).

(Continued)

*Primary Examiner* — John C Ingham
(74) *Attorney, Agent, or Firm* — Gates & Cooper LLP

(57) ABSTRACT

A high brightness III-Nitride based Light Emitting Diode (LED), comprising multiple surfaces covered by Zinc Oxide (ZnO) layers, wherein the ZnO layers are grown in a low temperature aqueous solution and each have a (0001) c-orientation and a top surface that is a (0001) plane.

22 Claims, 8 Drawing Sheets

(56) References Cited

U.S. PATENT DOCUMENTS

| | | |
|---|---|---|
| 2007/0001186 A1 | 1/2007 | Murai et al. |
| 2007/0222353 A1 | 9/2007 | Ren et al. |
| 2009/0098043 A1 | 4/2009 | Song et al. |
| 2010/0263586 A1 | 10/2010 | Richardson et al. |
| 2010/0308323 A1 | 12/2010 | Chang Jean et al. |
| 2011/0089398 A1 | 4/2011 | Pan et al. |
| 2011/0101414 A1 | 5/2011 | Thompson et al. |
| 2011/0108873 A1 | 5/2011 | Richardson et al. |
| 2011/0127551 A1 | 6/2011 | Pan et al. |

OTHER PUBLICATIONS

Elmmer, K. et al., "Resistivity of polycrystalline zinc oxide films: current status and physical limit," Journal of Physics D. 34(21), 2001, pp. 3097-3108.

Kim, K. et al., "Enhanced light extraction efficiency of GaN-based light-emitting diodes with ZnO nanorod arrays grown using aqueous solution," Applied Physics Letters 94, 071118 (2009).

Lange, F., "Chemical solution routes to single-crystal thin films," Science, vol. 273, No. 5277, Aug. 16, 1996, pp. 903-909.

Li, W. et al., "Growth mechanism and growth habit of oxide crystals," Journal of Crystal Growth 203 (1999) 186-196.

Mariano, A. et al., "Crystallographic polarity of ZnO crystals," Journal of Applied Physics, vol. 34, No. 2, Feb. 1963, 384-388.

Murai, A. et al., "Hexagonal pyramid shaped light-emitting diodes based on ZnO and GaN direct wafer bonding," Applied Physics Letters 89, 171116 (2006).

Murai, A. et al., "Mega-cone blue LEDs based on ZnO/GaN direct wafer bonding," Phys. Stat. Sol. (c) 4, No. 7, 2756-2759 (2007).

Oner, M. et al., "Control of ZnO crystallization by a PEO-b-PMAA diblock copolymer," Chem. Mater. 1998, 10, 460-463.

Perkins et al.; "A Liquid-Phase Quartz Crystal Microbalance for Photovoltaics Research," National Renewable Energy Laboratory, May 2008, 8 pages.

Richardson, J. et al., "Controlling low temperature aqueous synthesis of ZnO. 2. A novel continuous circulation reactor," Crystal Growth & Design, vol. 9, No. 6, 2009, pp. 2576-2581.

Schmidt-Mende et al.; "ZnO—nanostructures, defects, and devices," Department of Materials Science, vol. 10, No. 5, May 2007, pp. 40-48.

Sounart et al.; "Sequential Nucleation and Growth of Complex Nanostructured Films," Advanced Functional Materials, vol. 16, 2006, pp. 335-344.

Thompson, D. et al., ABSt 7th Int. Conf. Nitride Semiconductors, 2007, A3, 3 pages.

Tian, Z. et al., "Complex and oriented ZnO nanostructures," Nature Materials, vol. 2, Dec. 2003, 821-826.

Van De Walle, C., "Hydrogen as a cause of doping in zinc oxide," Physical Review Letters 85(5), 2000, pp. 1012-1015.

Van De Walle, C. et al., "Universal alignment of hydrogen level in semiconductors, insulators and solutions," Nature, vol. 423, Jun. 5, 2003, pp. 626-628.

Zhong, J. et al., "Integrated ZnO nanotips of GaN light emitting diodes for enhanced emission efficiency," Applied Physics Letters 90, 203515 (2007).

International Search Report and Written Opinion of the International Searching Authority for International Application No. PCT/US10/31286 mailed Jun. 28, 2010.

International Search Report and Written Opinion of the International Searching Authority for International Application No. PCT/US2010/055278 mailed Dec. 30, 2010.

International Search Report for International Application No. PCT/US2010/055293 filed on Nov. 3, 2010.

Andeen, D. et al., "Lateral epitaxial overgrowth of ZnO in water at 90° C.," Adv. Funct. Mater. 2006, 16, 799-804.

Chang, K. et al., "Investigation of indium-tin-oxide ohmic contact to p-GaN and its application to high-brightness GaN-based light-emitting diodes," Solid-State Electronics 49 (2005) 1381-1386.

Horng, R. et al., "GaN-based light-emitting diodes with indium tin oxide texturing window layers using natural lithography," Applied Physics Letters 86, 221101 (2005).

Kim, J. et al., "Growth of heteroepitaxial ZnO thin films on GaN-buffered $Al_2O_3$ (0001) substrates by low-temperature hydrothermal synthesis at 90° C.," Adv. Funct. Mater. 2007, 17, 463-471.

Margalith, T. et al., "Indium tin oxide contacts to gallium nitride optoelectronic devices," Applied Physics Letters, vol. 74, No. 26, Jun. 28, 1999, 3930.

Nakahara, K. et al., "Improved external efficiency InGaN-based light-emitting diodes with transparent conductive Ga-doped ZnO as p-electrodes," vol. 43, No. 2A, 2004, pp. L180-L182.

Richardson, J. et al., "Controlling low temperature aqueous synthesis of ZnO. 1. Thermodynamic analysis," Crystal Growth & Design, 2009, vol. 9, No. 6, 2570-2575.

Richardson, J. et al., "Low temperature aqueous deposition of ZnO on GaN LEDs," SSLEC Annual Review Nov. 5, 2009.

Sheu, J. et al., "Enhanced efficiency of GaN-based light-emitting diodes with periodic textured Ga-doped ZnO transparent contact layer," Applied Physics Letters 90, 263511 (2007).

Song, J. et al., "Highly low resistance and transparent Ni/ZnO ohmic contacts to p-type GaN," Applied Physics Letters, vol. 83, No. 3, Jul. 21, 2003, 479.

Thompson, D. et al., "Light emitting diodes with ZnO current spreading layers deposited from a low temperature aqueous solution," Applied Physics Express 2 (2009) 042101.

Tian, Z. et al., "Complex and oriented ZnO nanostructures," Nature Materials , vol. 2, Dec. 2003, 821.

\* cited by examiner (d)

(e)

HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION

CROSS REFERENCE TO RELATED APPLICATIONS

This application claims priority under 35 U.S.C. §119(e) to the following co-pending and commonly-assigned U.S. Provisional Patent Applications:

U.S. Provisional Patent Application Ser. No. 61/257,812, entitled "HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION," filed on Nov. 3, 2009,by Daniel B. Thompson, Jacob J. Richardson, Ingrid Koslow, Jun Seok Ha, Frederick F. Lange, Steven P. DenBaars, and Shuji Nakamura,;

U.S. Provisional Application Ser. No. 61/257,811,filed on Nov. 3, 2009,by Jacob J. Richardson, Daniel B. Thompson, Ingrid Koslow, Jun Seok Ha, Frederick F. Lange, Steven P. DenBaars, and Shuji Nakamura, entitled "A LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS,"; and U.S. Provisional Application Ser. No. 61/257,814, filed on Nov. 3, 2009, by Daniel B. Thompson, Jacob J. Richardson, Steven P. DenBaars, Frederick F. Lange, and Jin Hyeok Kim, entitled "LIGHT EMITTING DIODES WITH ZINC OXIDE CURRENT SPREADING AND LIGHT EXTRACTION LAYERS DEPOSITED FROM LOW TEMPERATURE AQUEOUS SOLUTION,";

which applications are incorporated by reference herein.

This application is related to the following co-pending and commonly-assigned U.S. patent applications:

U.S. Utility patent application Ser. No. 12/761,246, filed on Apr. 15, 2010, by Jacob J. Richardson and Frederick F. Lange, entitled "LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS," which application claims priority under 35 U.S.C. §119(e) to and commonly-assigned U.S. Provisional Patent Application Ser. No. 61/169,633, filed on Apr. 15, 2009, by Jacob J. Richardson and Frederick F. Lange, entitled "LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS,";

U.S. Utility application Ser. No. 12/938,872,filed on Nov. 3,2010, by Jacob J. Richardson, Daniel B. Thompson, Ingrid Koslow, Jun Seok Ha, Frederick F. Lange, Steven P. DenBaars, and Shuji Nakamura, entitled "A LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS,", which application claims priority under 35 U.S.C. .sctn.119(e) to and commonly-assigned U.S. Provisional Application Ser. No. 61/257,811, filed on Nov. 3, 2009, by Jacob J. Richardson, Daniel B. Thompson, Ingrid Koslow, Jun Seok Ha, Frederick F. Lange, Steven P. DenBaars, and Shuji Nakamura, entitled "A LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS,"; and U.S. Utility application Ser. No. 12/939,044, filed on Nov. 3,2010, by Daniel B. Thompson, Jacob J. Richardson, Steven P. DenBaars, Frederick F. Lange, and Jin Hyeok Kim, entitled "LIGHT EMITTING DIODES WITH ZINC OXIDE CURRENT SPREADING AND LIGHT EXTRACTION LAYERS DEPOSITED FROM LOW TEMPERATURE AQUEOUS SOLUTION,", which application claims priority under 35 U.S.C. §119(e) to and commonly-assigned U.S. Provisional Application Ser. No. 61/257,814, filed on Nov. 3, 2009, by Daniel B. Thompson, Jacob J. Richardson, Steven P. DenBaars, Frederick F. Lange, and Jin Hyeok Kim, entitled "LIGHT EMITTING DIODES WITH ZINC OXIDE CURRENT SPREADING AND LIGHT EXTRACTION LAYERS DEPOSITED FROM LOW TEMPERATURE AQUEOUS SOLUTION,";

which applications are incorporated by reference herein.

BACKGROUND OF THE INVENTION

1. Field of the Invention

This invention relates to enhancing light extraction from high brightness light emitting diodes (LEDs).

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

It has been reported that transparent conductive oxide (TCO) films consisting of indium-tin-oxide (ITO) [1,2], Zinc Oxide (ZnO) [3], or aluminum-doped-zinc-oxide (AZO) [4] improve external quantum efficiency when applied to the surface of GaN LEDs. In addition, it has been shown that low temperature aqueous deposition can be used to fabricate ZnO current spreading layers on GaN LEDs, see [11]. Compared to a conventional thin metal current spreading layer, the ZnO layer deposited from low temperature aqueous solution improved light power output by over 90%. It has also been shown that several methods of transparent conductive oxide (TCO) layer surface roughening can also improve light extraction from LEDs [5,6]. However, all of this prior research has been conducted using TCO layers deposited only on Ga faced c-plane, p-type GaN surfaces of LEDs.

SUMMARY OF THE INVENTION

To improve the light extraction efficiency of LEDs, transparent conductive oxides (TCOs) with high refractive indices, such as indium-tin-oxide (ITO), ZnO, aluminum-doped-zinc-oxide (AZO), are widely used. When applied to the surface of an LED, films of these materials increase the probability of light escaping the LED through the TCO. The probability that a photon will pass from a high index of refraction material to a material with a lower, yet close, index of refraction is significantly improved over the probability that a photon will pass from a high index material to a low index material. The refractive index of Zn, which is approximately 2.1, is between that of III-Nitride materials used for LEDs, e.g. $n_{GaN}$=2.5, and all the currently used encapsulants known to the inventors. Thus, a layer of ZnO on a surface of a III-Nitride LED is expected to aid photons in escaping that LED surface.

Using the Fresnel equations, it is possible to calculate the enhancement in light transmission from a LED surface using a layer of intermediate refractive index, e.g., a ZnO layer. As an example, a photon with a 450 nm wavelength and normal incidence on a GaN and ZnO interface has a 95% probability of passing through the ZnO and then into an encapsulant of index 1.4, while a photon with normal incidence on an interface between GaN and the same encapsulant, has a only a 92% probability of passing through the GaN into the encapsulant. Going from normal incidence to shallower angles of incidence, the enhancement in the probability of transmission becomes even greater. Without a ZnO layer, the probability transmission from the GaN directly into the encapsulant drops to 0% at incidence angles higher than the critical angle of 34°. When a ZnO layer is present, the critical angle is increased to 42°. In total, these effects are expected to result in a 27% increase in transmission through a GaN/ZnO/encapsulant surface as compared to a GaN/encapsulant surface.

Thus, TCOs of intermediary refractive indices, i.e. an index between that of the most external III-Nitride layer and the material immediately surrounding the TCO, allow more of the photons produced in the LED's active region to pass through the external surface without being reflected back into the LED. In state of the art LEDs, TCOs of this nature are usually deposited on the p-type GaN terminated (0001) surface of the LED. However, the active region of the LED emits light in all directions. This means a large portion of the light generated is not immediately directed through the p-type GaN surface. Light not directed to the TCO coated surface will have a smaller chance of escape and will be more likely to be internally reflected several times before escaping the LED. The longer path length of these internally reflected photons makes for a greater probability of those photons being reabsorbed. This in turn lowers the LED's external quantum efficiency.

Depositing high refractive index TCO layers on the other surfaces of the LED would allow a larger number of photons to escape without being internally reflected, thus increasing the external quantum efficiency of the LED. However, most of the techniques typically used for depositing TCO films are either not capable of depositing on multiple surfaces of the LED, or doing so would be cost prohibitive. This has limited the use of TCO layers for enhancing light extraction from multiple LED surfaces.

In this disclosure, the present invention describes LED structures which utilize TCO layers on one or more surfaces. The TCO used is ZnO deposited by a low temperature aqueous route. This is a low cost, flexible method that can grow ZnO layers before or after the LED chip fabrication processing. The present invention also describes how these ZnO layers can be etched to produce a surface texture to further increase the light extraction from the LEDs. The high electrical conductivity, good thermal conductivity, high light transmission, and surface texturing possible with ZnO layers, combined with the low cost and simplicity of low temperature aqueous processing will be useful for developing low cost, high light output GaN LED devices. This method can be used to deposit ZnO layers on both vertical and lateral type LEDs, using either bulk GaN or heteroepitaxial substrates.

To overcome the limitations in the prior art, and to overcome other limitations that will become apparent upon reading and understanding the present specification discloses an optoelectronic device, comprising a high brightness III-Nitride based LED, wherein multiple surfaces (e.g., light transmitting surfaces) of the LED are covered by one or more Zinc Oxide (ZnO) layers.

Multiple surfaces of the LED may be covered by the ZnO layers. The ZnO layers may encapsulate or surround the LED.

One or more of the light transmitting surfaces, covered by the ZnO layers, may be different from a p-type III-Nitride c-plane surface (e.g., different from a Ga faced c-plane surface of p-type III-nitride). One or more of the light transmitting surfaces may include at least one III-Nitride semipolar or nonpolar surface. One or more of the light transmitting surfaces may include at least one non-III-Nitride surface.

One or more of the ZnO layers may include at least one epitaxial ZnO layer covering or grown on a III-Nitride surface of the LED.

A surface different from a Ga faced c-plane surface may be an N faced c-plane surface. A surface different from a Ga faced c-plane surface may be a III-Nitride non-polar or semipolar plane surface. The surface different from a c-plane surface may be a surface that is not a III-Nitride surface.

A p-type III-Nitride surface of the device may also be a light transmitting surface and be covered by at least one of the ZnO layers. Or, a p-type III-Nitride surface of the device may not be a light transmitting surface and is covered by a reflective p-contact layer.

The III-Nitride LED may be a conventional LED grown on a heteroepitaxial substrate or a homoepitaxial LED grown on a bulk GaN substrate.

The III-Nitride LED may be a lateral (mesa) or vertical architecture type device.

The ZnO layers on one or more of the surfaces may be one or more epitaxial ZnO layer, wherein the epitaxy is with a III-Nitride layer or layers.

One or more of the ZnO layers may include one or more polycrystalline ZnO layers with a preferential crystalline grain texture such that, on average, ZnO crystals in the polycrystalline ZnO layers are oriented with their [0001] c-direction perpendicular to the covered light transmitting surfaces.

The LED may further comprise an n-type layer; a p-type layer; an active layer, for emitting light, between the n-type layer and the p-type layer, wherein (1) the multiple surfaces are light transmitting surfaces, for transmitting the emitted light, and include a bottom surface of the LED, sidewalls of the LED, or a top surface of the LED, and (2) at least one of the ZnO layers is on a light transmitting surfaces, and the ZnO layers increase light extraction from the LED.

The present invention further discloses a method of fabricating an optoelectronic device with improved light extraction efficiency, comprising covering multiple surfaces of a III-Nitride LED with one or more Zinc Oxide (ZnO) layers. The covering may include growing the ZnO.

The growth of the ZnO layers may be performed in one or more steps, wherein at least one step involves growing ZnO from an aqueous solution. The aqueous solution used for ZnO growth may contain dissolved Zn(II) provided by dissolving a soluble Zn(II) salt, or by dissolving ZnO. The growth from aqueous solution may be performed at a temperature of less than 100° C. Alternatively, the growth from aqueous solution may be performed at a temperature less than the boiling point of the aqueous solution, wherein that boiling point may be less than or greater than 100° C. The ZnO layers may be formed from aqueous solution by a chemical reaction of the dissolved Zn(II) to form ZnO, wherein the chemical reaction is caused, intensified, or otherwise controlled by an increase in the temperature of the growth solution, or by a change in the pH of the growth solution. The conditions, e.g., temperature, constituent concentrations, or pH, of the aqueous growth step may be used to control the crystal orientation or texture, thickness, or surface morphology of the ZnO layer produced.

The growth of the ZnO layers may include a seed layer deposition step, where a thin crystalline ZnO seed layer is formed on one or more surfaces of the III-Nitride LED. A seed layer may be deposited from aqueous solution as described above. Alternatively, a seed layer may be deposited by first depositing a Zn(II) precursor, dissolved in a solvent, on one or more surfaces to form precursor films, followed by annealing the precursor film to convert the precursor film to a crystalline ZnO film. Alternatively, the seed may be deposited using a vapor phase method, e.g., sputtering, evaporation, or chemical vapor deposition.

The growth of ZnO layers may comprise converting one or more seed layers to a thicker ZnO layer, by growing further ZnO on the seed layer from an aqueous solution, as described above. The conditions used for the deposition of the Zn(II) precursor film, or for the conversion of the Zn(II) precursor film into a crystalline ZnO layer, may be used to control the crystal orientation or texture, thickness, or surface morphology of final ZnO layers.

One or more of the ZnO layers may be roughened in a way that increases light extraction from the LED. The crystal orientation or texture, thickness, or surface morphology of the ZnO layers grown on light transmitting surfaces of the III-Nitride LED may be controlled to enhance the light extraction from those surfaces of the LED.

BRIEF DESCRIPTION OF THE DRAWINGS

Referring now to the drawings in which like reference numbers represent corresponding parts throughout.

DETAILED DESCRIPTION OF THE INVENTION

Figure 1:
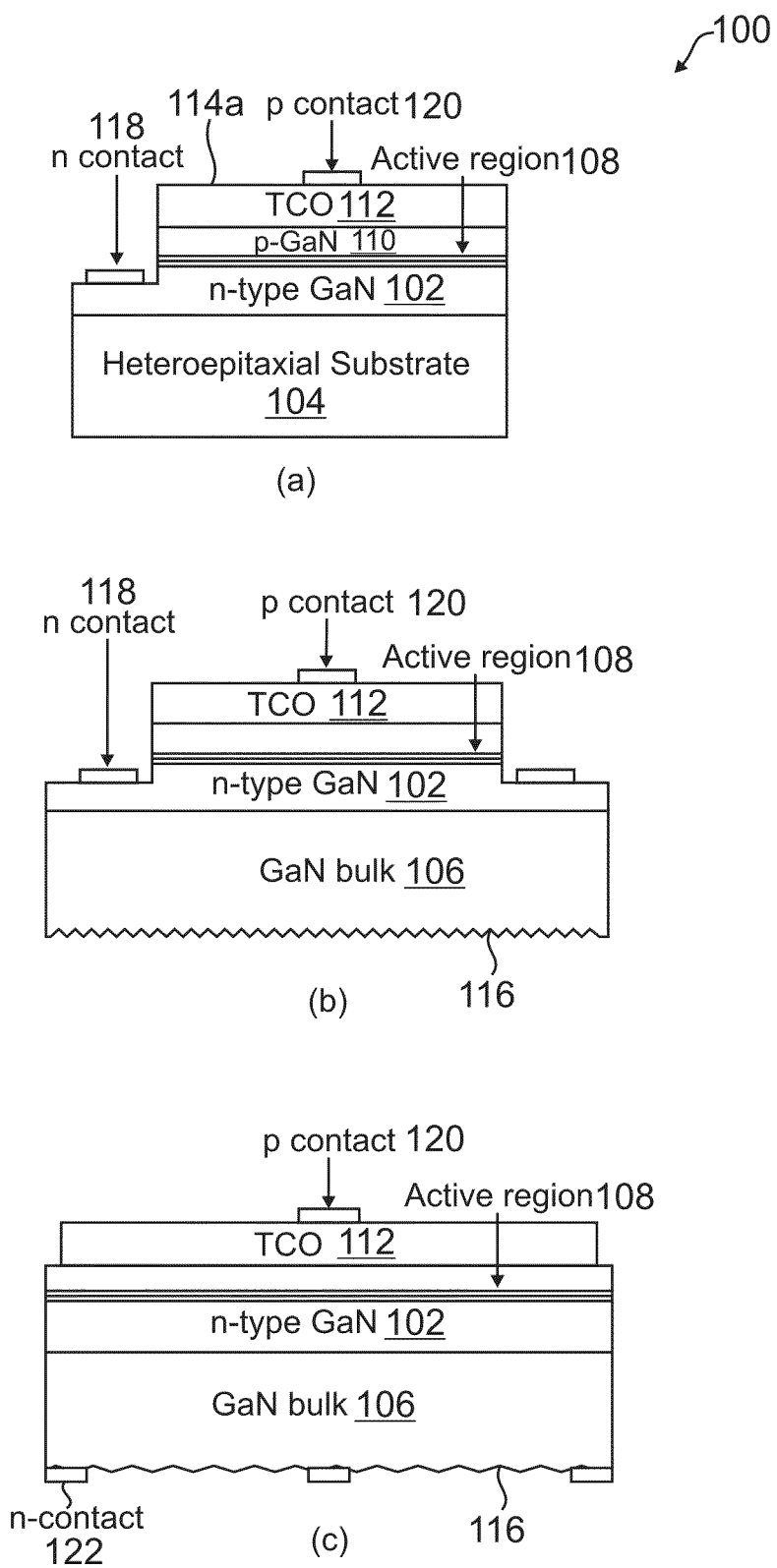
FIGS. 1(a)-(e) show cross-sectional schematics of the conventional LED structures with a TCO layer on p-type GaN layer.
Figure 1:
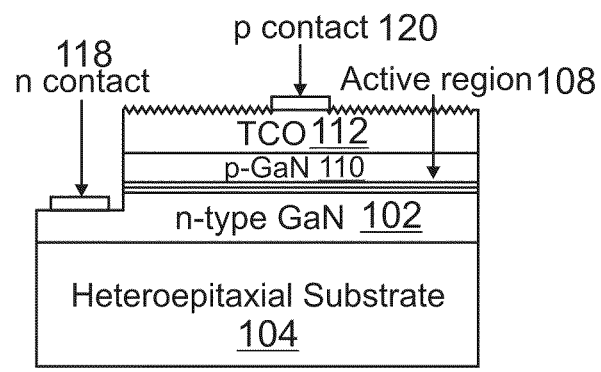
Figure 1:
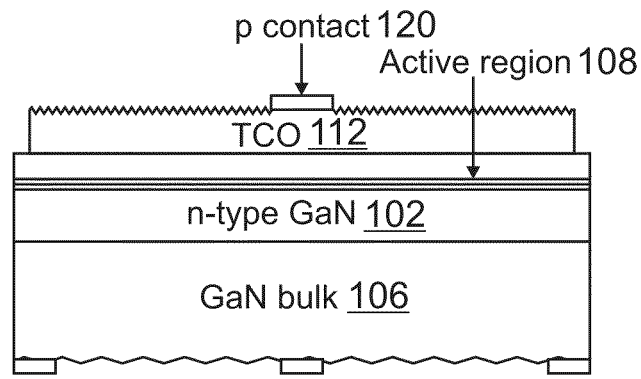

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The purpose of this invention is to improve the performance of III-Nitride (e.g., GaN) LEDs through the addition of ZnO layers to the LED's surfaces. These layers can improve the light extraction, heat dissipation, and current distribution of the device. Due to energy concerns, efficient LED lighting technology is of current and expanding importance. However, the cost of LED lighting remains high and is a major impediment to the greater implementation of the technology. This invention allows the power output of LEDs to be increased, for example, by over 90%, without substantially increasing the cost of the device.

Technical Description

Nomenclature

III-nitrides may be referred to as group III-nitrides, nitrides, or by (Al,Ga,In)N, AlInGaN, or $Al_{(1-x-y)}In_yGa_xN$ where $0<x<1$ and $0<y<1$, for example.

These terms are intended to be broadly construed to include respective nitrides of the single species, Al, Ga, and In, as well as binary, ternary and quaternary compositions of such Group III metal species. Accordingly, the terms comprehend the compounds AN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species.

Further, (Al,Ga,In)N materials within the scope of the invention may further include minor quantities of dopants and/or other impurity or inclusional materials. Boron may also be included in the III-nitride alloy.

Similarly, the terms zinc oxide or ZnO are intended to be broadly construed to include any material where the component species Zn and O make up the majority of the compound, and the material retains the hexagonal Wurtzite crystal structure of ZnO. This is inclusive of aluminum doped zinc oxide (AZO), gallium doped zinc oxide (GZO), and indium doped zinc oxide (IZO). This also includes materials with minor quantities of other dopants and/or other impurity or inclusional materials, as well as materials that are off-stoichiometric due to the presence of vacancy and interstitial type material defects.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in GaN or III-nitride optoelectronic devices is to grow the devices on nonpolar planes of the crystal. Such planes contain equal numbers of Ga and N atoms and are charge-neutral. Furthermore, subsequent nonpolar layers are equivalent to one another so the bulk crystal will not be polarized along the growth direction. Two such families of symmetry-equivalent nonpolar planes in GaN or III-nitride are the {11-20} family, known collectively as a-planes, and the {1-100} family, known collectively as m-planes.

Another approach to reducing or possibly eliminating the polarization effects in GaN optoelectronic devices is to grow the devices on semi-polar planes of the crystal. The term "semi-polar planes" can be used to refer to a wide variety of planes that possess both two nonzero h, i, or k Miller indices and a nonzero l Miller index. Thus, semipolar planes are defined as crystal planes with nonzero h or k or i index and a nonzero l index in the (hkil) Miller-Bravais indexing convention. Some commonly observed examples of semi-polar planes in c-plane GaN heteroepitaxy include the (11-22), (10-11), and (10-13) planes, which are found in the facets of pits. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

The Gallium or Ga face of GaN is the $c^+$ or (0001) plane, and the Nitrogen or N-face of GaN or a III-nitride layer is the $c^-$ or (000-1) plane.

LED Structures

This invention describes an LED structure with ZnO layers deposited on one or more surfaces other than a (0001) p-type III-Nitride surface. The present invention further describes ZnO layers deposited on multiple surfaces of the LED. The multiple surfaces may include (0001) p-type GaN surfaces and surfaces other than (0001) p-type GaN surfaces.

The present invention includes ZnO layers that have been etched, or otherwise treated, subsequent to growth to alter the surface roughness or morphology of the film. The purpose of the ZnO layers in such a structure is to enhance light extraction, and/or help dissipate heat, and/or serve as a transparent current spreading layer. It is well established that the basal planes of ZnO tend to etch into hexagonal pits and pyramids, and that such etched structures serve to enhance light extraction when applied to the surfaces of LED devices. It is therefore useful to be able to grow c-direction oriented ZnO films on different LED surfaces. In other situations, it may be beneficial for the ZnO layers to be epitaxial with respect to the underlying crystal. Epitaxial films should display higher electronic mobility, thermal conductivity, and optical transparency.

Here, the present invention describes low cost solution based processes for synthesizing c-direction oriented ZnO layers and/or epitaxial ZnO layers on multiple surfaces of a LED structure.

FIGS. 1(a)-(c) show the schematic diagrams of conventional structured LEDs 100, comprising an n-type GaN layer 102 on a sapphire 104 or GaN substrate (e.g., GaN bulk) 106, an active layer 108 or region on the n-type GaN layer 102, and a p-type GaN layer (p-GaN layer) 110 on the active layer 108.

FIG. 1(a) is an LED 100 using a TCO layer 112 on top of the p-type GaN layer 110, with a heteroepitaxial substrate 104. FIGS. 1(b) and (c) are LEDs grown on bulk GaN substrates 106, and using a TCO layer 112 on a p-type GaN layer 110. The backside surface of the GaN substrate 106 may be roughened 116 to enhance light extraction.

Also shown are the n-contact 118 on the n-type GaN layer 102, the p-contact 120 on the TCO layer 112, and an n-contact 122 to the GaN bulk 106. FIG. 1(d)-(e) illustrate roughened TCO layers 112.

Figure 2:
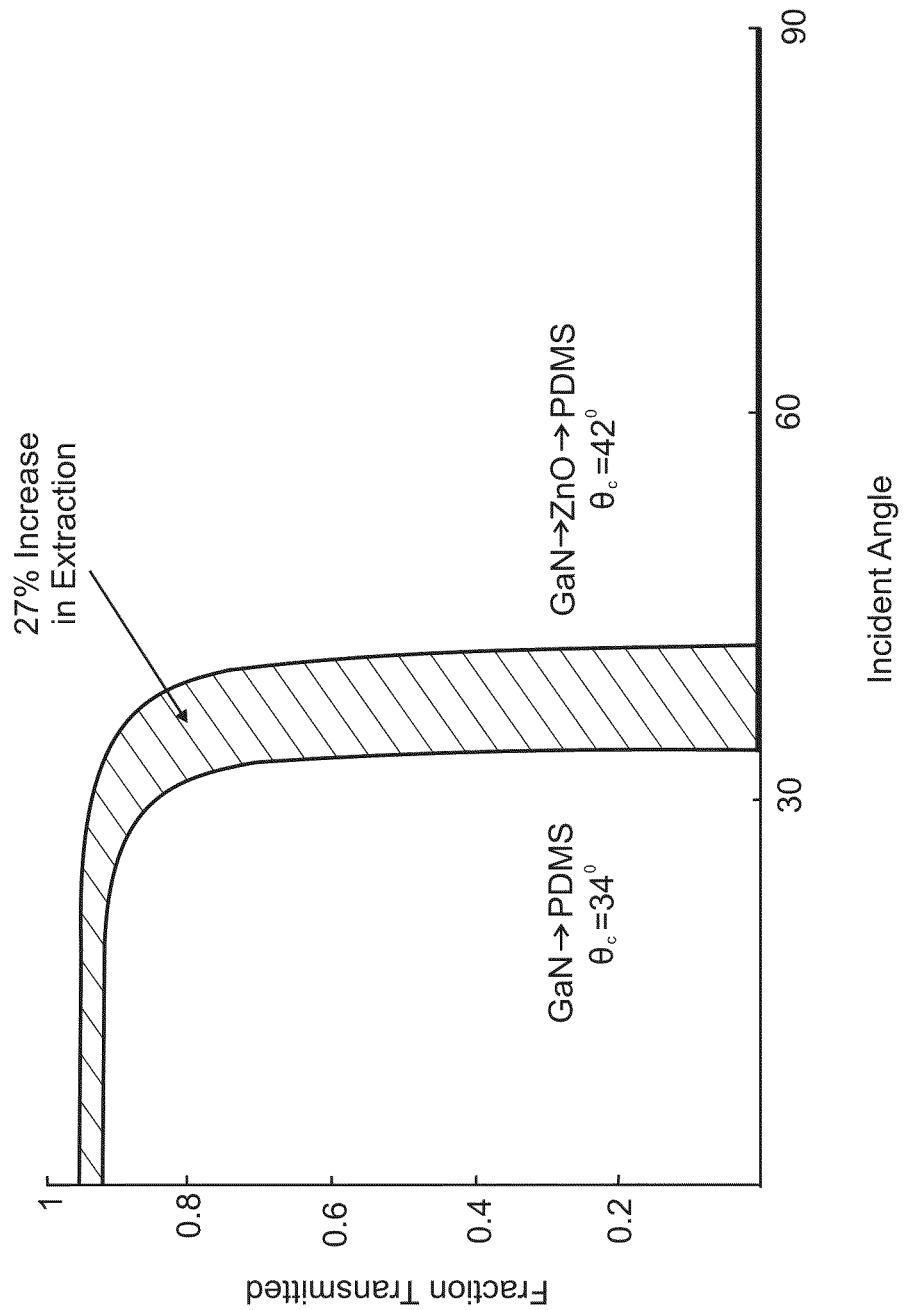
FIG. 2 shows the calculated probability of light transmission as a function of incidence angle through a GaN/Polydimethylsiloxane (PDMS) encapsulant interface and through a GaN/ZnO/PDMS encapsulant double interface.

FIG. 2 shows the calculated probability of light transmission as a function of incidence angle through a GaN/Polydimethylsiloxane (PDMS) encapsulant interface (critical angle $\theta_c=34°$) and through a GaN/ZnO/PDMS encapsulant double interface (critical angle $\theta_c=42°$), showing a 27% increase in extraction using the ZnO layer.

Figure 3:
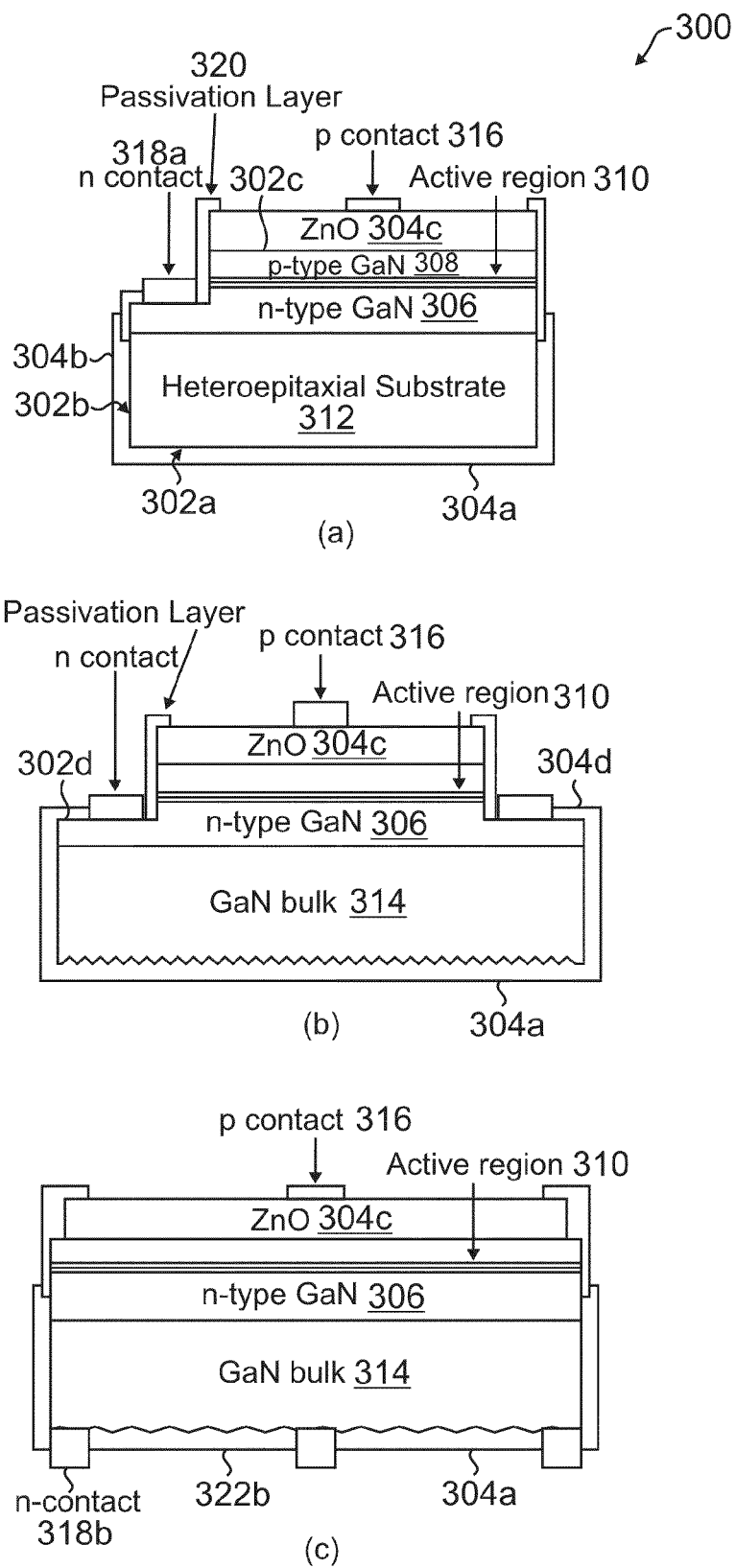
FIGS. 3(a)-(f) show cross-sectional schematics of the new LED structures with ZnO layer on multiple surface planes, according to the present invention.
Figure 3:
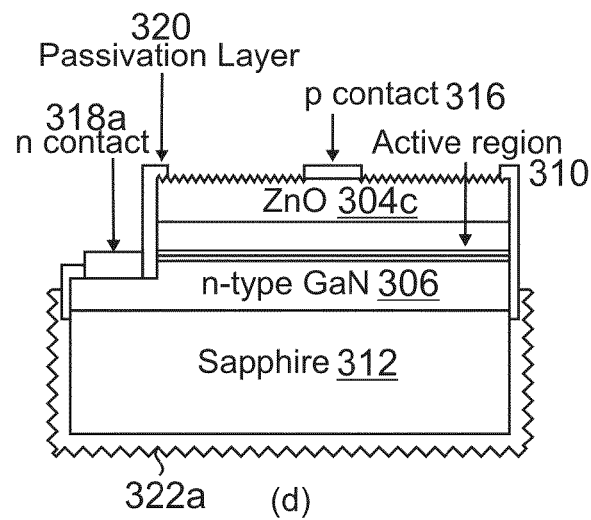
Figure 3:
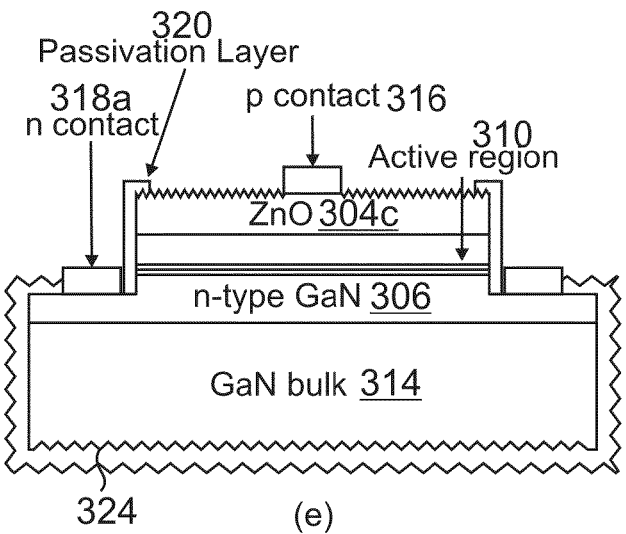
Figure 3:
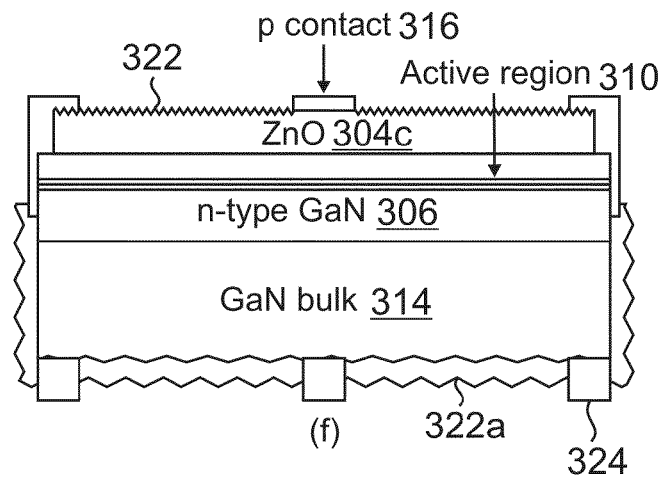
Figure 4:
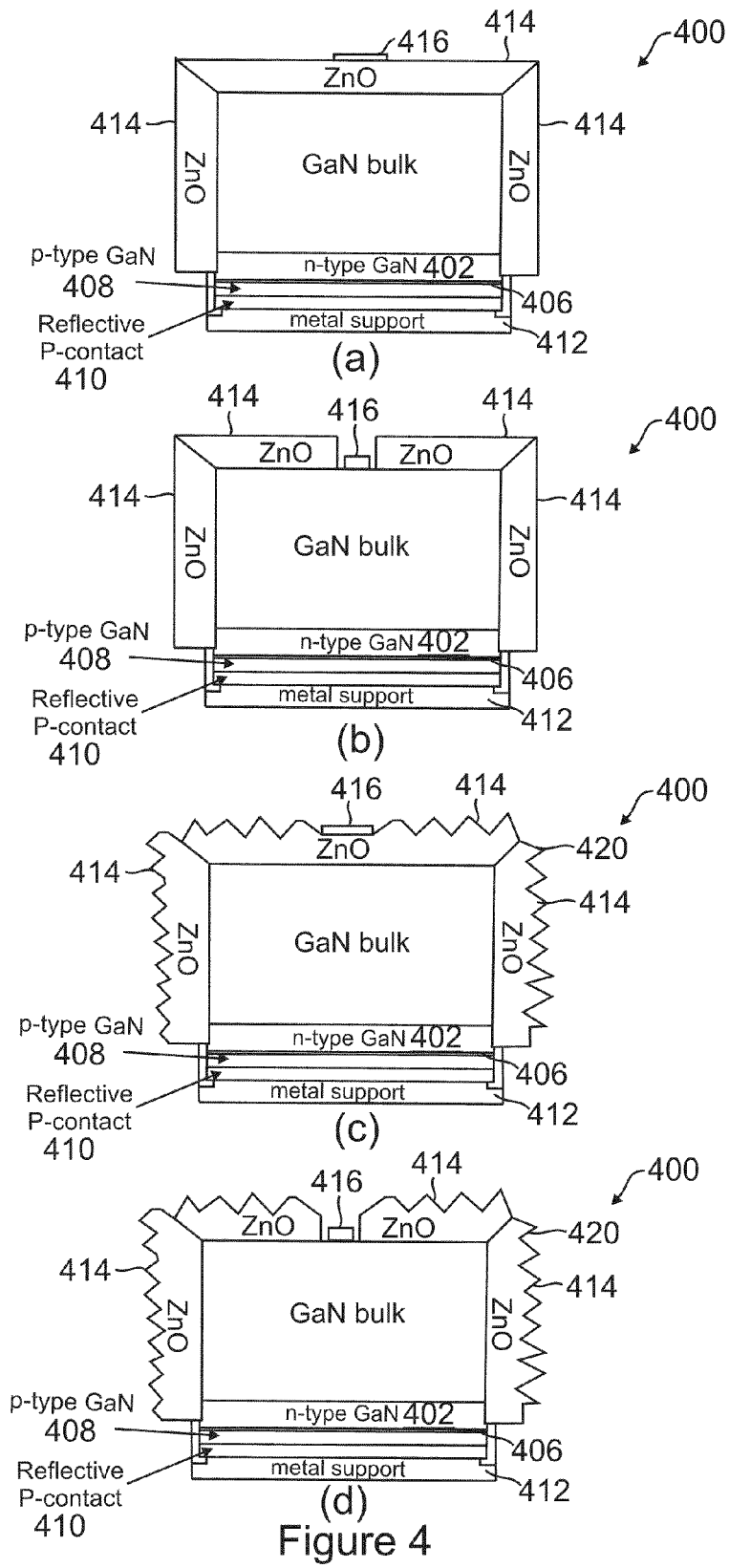
FIG. 4(a)-(d) shows cross-sectional schematics of the new LED structures with ZnO layers, according to another embodiment of the present invention.

FIGS. 3 and 4 show schematic diagrams of LED devices utilizing ZnO films on multiple LED surfaces. Different variations on these types of structures can also be made, and multiple processing methods could be used to realize these types of structures. Here, the present invention shows results from LED devices on bulk GaN substrates. These LEDs were fully fabricated and the ZnO layers were deposited as a final step.

FIG. 3 and FIG. 4 show the schematic diagrams of the new present invention. A difference from the conventional LED 100 structures is that in the present invention, multiple surfaces 302a, 302b, 302c, and 302d of the LED 300 are covered by ZnO layers 304a, 304b, 304c, and 304d, where at least one of those surfaces is different from the p-type surface 302c. The ZnO layers 304a-d may encapsulate or surround the LED.

In the embodiments of FIG. 3(a)-(f), the LED 300 comprises a III-nitride n-type layer 306; a III-nitride p-type layer 308; a III-nitride active layer 310, for emitting light, between the n-type layer 306 and the p-type layer 308, wherein (1) a plurality of multiple surfaces 302a, 302b, 302c, 302d are light transmitting surfaces, for transmitting the emitted light, and include a bottom surface 302a of the LED 300, sidewalls 302b of the LED, a top surface 302c of the LED, and a surface of the n-type layer 302d, and (2) at least one of the ZnO layers 304a-d is on each of the light transmitting surfaces and the ZnO layers 304a-d increase light extraction from the LED. Also shown is the LED grown on a heteroepitaxial substrate 312 or a bulk GaN 314 substrate.

The top surface 302c is the surface of the p-type layer 308.

The sidewalls 302b may include the sidewalls the substrate 314, the n-type layer 306, the active layer 310 and/or the p-type layer 308.

A p-type contact 316 (p-contact) ohmically contacts the ZnO layer 304c, an n-type contact 318a (n-contact) ohmically contacts the n-type layer 306 and/or the ZnO layer 304d, or an n-contact 318b ohmically contacts the bulk GaN 314 and/or the ZnO layer 304a, and a passivation layer 320 is on the sidewalls of the n-type layer 306, the p-type layer 308, and the active region 310.

In the case of FIG. 3(d), (e) and (f), the ZnO layers 304a-d on all the surface planes 302a-d have a roughness or structuring 322a by etching to increase light extraction efficiency. However, the ZnO layers 304a-d may also be a planar surface 322b. At least one of the surfaces of the substrate, e.g. the bottom light extracting surface of the GaN bulk 314, may also be roughened 324 to enhance light extraction.

The enhancement of extraction may be by scattering, reduced total internal reflection, diffraction, or photonic crystal effects, for example. The roughening or structuring 322a of the ZnO layer may create structures in the ZnO layer surface having dimensions sufficiently close to a wavelength of the light emitted by the LED, for example, so that the light may be scattered, diffracted, reflected, or otherwise interact electromagnetically with the structures.

A ZnO layer 304a-d may be a polycrystalline layer with a grain texture providing an average crystal orientation of the grains with the [0001] c-direction perpendicular to the light transmitting surfaces 302a such that a ZnO layer 304a-d has a surface comprising of the (0001) c-plane of ZnO.

FIG. 4(a)-(d) are cross-sectional schematics of an optoelectronic device, comprising a III-Nitride LED 400, wherein the LED 400 device includes an n-type GaN layer 402 grown on a GaN bulk substrate 404, a III-Nitride active layer 406 grown on the n-type GaN layer 402, a p-type GaN layer 408 grown on the active layer 406, a reflective p-type contact 410 deposited on the p-type GaN 408, a metal support 412 on the reflective p-contact 410, one or more ZnO layers 414 on the n-type GaN 402 and/or on the GaN bulk 404, and an n-type pad 416 on the ZnO layers 414 (FIG. 4(a) and FIG. 4(c)), or on the GaN bulk 404 (FIG. 4(b) and FIG. 4(d)). The ZnO layers 414 have a planar surface 418 (FIG. 4(a)-(b)) or a roughened surface 420 (FIG. 4(c)-(d)).

Thus, FIGS. 3(a)-(f) and FIGS. 4(a)-(d) illustrate an optoelectronic device, comprising a III-Nitride LED 300, 400 wherein multiple light transmitting surfaces 302a-c of the LED 300 are covered by one or more ZnO layers 304a, 414. One or more of the light transmitting surfaces 302a, covered by the ZnO layers 304a, include surfaces different from a p-type III-Nitride c-plane surface. One or more of the light transmitting surfaces, covered by the ZnO layers 414, may include at least one III-Nitride semipolar or nonpolar surface, at least one non-III-Nitride surface 302a, and/or at least one epitaxial ZnO layer 304c covering a III-Nitride surface 302c of the LED 300.

The III-Nitride LED may be a conventional LED grown on a heteroepitaxial substrate 312 or a homoepitaxial LED grown on a bulk GaN substrate 314. The III-Nitride LED may be a lateral (mesa) architecture type device 300 (as shown in FIGS. 3(a)-(b), or a vertical architecture type device 400 (as shown in FIGS. 4(a)-(d)).

A p-type III-Nitride surface 302c of the device may be a light transmitting surface and may be covered by at least one of the ZnO layers 304c. A p-type III-Nitride surface of a p-type layer 408 of the device may not be a light transmitting surface and may be covered by a reflective p-contact layer 410.

One or more of the ZnO layers 414 may be roughened 420 in a way that increases light extraction from the LED.

The light transmitting surfaces are typically transparent to transmit light having the wavelength emitted by LED.

ZnO Synthesis

ZnO shares the wurtzite crystal structure and is well lattice matched with GaN, a fact that will encourage the epitaxial growth of ZnO on any crystallographic plane of GaN. This is beneficial when attempting to grow c-direction oriented ZnO films on the basal planes of GaN, but makes the growth of c-direction oriented ZnO on the other planes of GaN difficult. For these planes, the growth of a c-direction oriented film requires inhibiting epitaxy. When epitaxial growth is inhibited, ZnO films with a preferential c-direction orientation will tend to result. This occurs for several reasons. First, non-epitaxial ZnO will tend to nucleate with a basal plane orientation to minimize surface energy. These oriented nuclei then grow into oriented grains. Secondly, c-direction oriented grains will tend to dominate in a thicker film due to the fact that non-oriented grains are self terminating. Because ZnO tends to grow faster in the [0001] direction, non-oriented grains will quickly run into adjacent grains, ending their growth. Meanwhile oriented grains can continue to grow normal to the surface, unimpeded. Conversely, when synthesizing epitaxial ZnO films, the nucleation of epitaxial seeds must be encouraged rather than inhibited. Once an epitaxial seed layer has been nucleated, further nucleation should then be minimized allowing the epitaxial seeds to grow into a thicker coalesced ZnO film.

Figure 5:
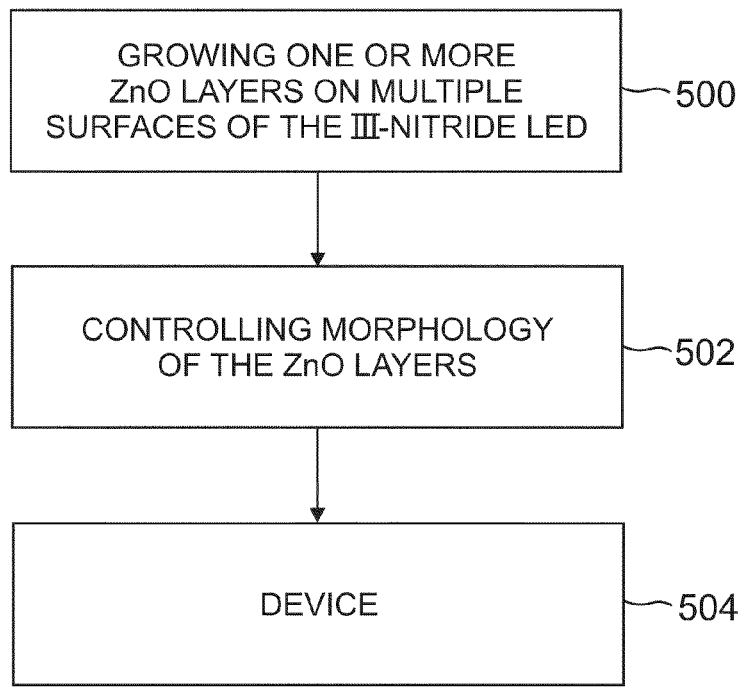
FIG. 5 is a flowchart illustrating a method of fabricating ZnO layers on multiple surfaces of a III-Nitride LED, according to one embodiment of the present invention.

FIG. 5 illustrates a method of fabricating a III-Nitride based LED with improved light extraction efficiency.

Block 500 represents covering multiple surfaces (e.g., III-Nitride or non-III-Nitride light transmitting surfaces) of the III-Nitride LED with one or more ZnO layers. The covering may include growing one or more ZnO layers on one or more light transmitting surfaces of a III-Nitride based LED, wherein the layers are grown on at least one light transmitting surface that is different from a p-type III-Nitride c-plane surface of the LED. The covering may include either epitaxial or polycrystalline (non-epitaxial) ZnO films on any of the multiple surfaces. The ZnO may be grown using one or more growth steps ZnO is grown from an aqueous solution containing dissolved Zn(II)[13]. The growth solution may be at a temperature less than the boiling point of the aqueous solution, such that the aqueous solution is a liquid aqueous solution. One or more of the ZnO layers may include one or more polycrystalline ZnO layers with a preferential crystalline grain texture such that, on average, ZnO crystals in the polycrystalline ZnO layers are oriented with their [0001] c-direction perpendicular to the covered light transmitting surfaces.

The growing may comprise growing the ZnO layers from an aqueous solution containing dissolved Zn(II), by means of a chemical reaction involving dissolved Zn(II), wherein the ZnO layers form on the light transmitting surfaces in contact with the aqueous solution.

A maximum temperature of the aqueous solution may be less than a boiling point of the aqueous solution. The dissolved Zn(II) in the aqueous solution may be supplied by dissolving a water soluble salt of Zn(II) and/or by dissolving ZnO.

The aqueous solution may be a growth solution, and the growing of the ZnO layers may be performed in one or more steps, such that, in any one or more of the steps, the reaction of the dissolved Zn(II) to form the ZnO layers is caused, intensified, or otherwise controlled by an increase in a temperature of the growth solution, or by a change in a pH of the growth solution.

A morphology of the ZnO layers produced may be modified by an addition of additives to the aqueous solution, wherein the additives include one or more of the following: metal citrate salts, citric acid, surfactants, polymers, biomolecules, or other molecules that interact with a surface of ZnO or the ZnO layers.

Block 502 represents controlling a morphology of the ZnO layers by creating one or more roughened, patterned, or structured surfaces of the ZnO layers that are suitable for enhancing the light extraction of light emitted by the LED. The crystal orientation or texture, thickness, or surface morphology of the ZnO layers grown on light transmitting surfaces of the III-Nitride LED may be controlled to enhance the light extraction from those surfaces of the LED. The creation of the roughened, patterned, or structured surfaces may include one or more steps involving removal of material from the preformed ZnO layers by means of physical or chemical etching. The roughened, patterned, or structured surfaces of the ZnO layers may be created during the process of synthesizing the ZnO layers in Block 500.

The conditions, e.g., temperature, constituent concentrations, or pH, of the aqueous growth step may be used to control the crystal orientation or texture, thickness, or surface morphology of the ZnO layer produced.

Block 504 represent the end result of the method, an optoelectronic device such as an LED, wherein one or more epitaxial ZnO layers are grown on one or more of the light transmitting III-Nitride multiple surfaces of the LED. The multiple surfaces may comprise at least one surface different from a Ga faced c-plane surface of a p-type layer of the III-Nitride based LED. A surface different from a Ga faced c-plane surface may be an N faced c-plane surface. A surface different from a Ga faced c-plane surface may be a III-Nitride non-polar or semi-polar plane surface. The surface different from a c-plane surface may be a surface that is not a III-Nitride surface.

The ZnO layers on one or more of the surfaces may be one or more epitaxial ZnO layers grown on, or covering, one or more III-Nitride or light transmitting III-Nitride surfaces of the LED, wherein the epitaxy is with a III-Nitride layer or layers.

The ZnO layers on one or more of the surfaces may be polycrystalline and textured such that on average the c-direction [0001] of the ZnO crystals of that layer are perpendicular to that surface.

The LED may further comprise an n-type layer; a p-type layer; an active layer, for emitting light, between the n-type layer and the p-type layer, wherein (1) the multiple surfaces are light transmitting surfaces, for transmitting the emitted light, and include a bottom surface of the LED, sidewalls of the LED, or a top surface of the LED, and (2) at least one of the ZnO layers is on a light transmitting surfaces, and the ZnO layers increase light extraction from the LED.

Figure 6:
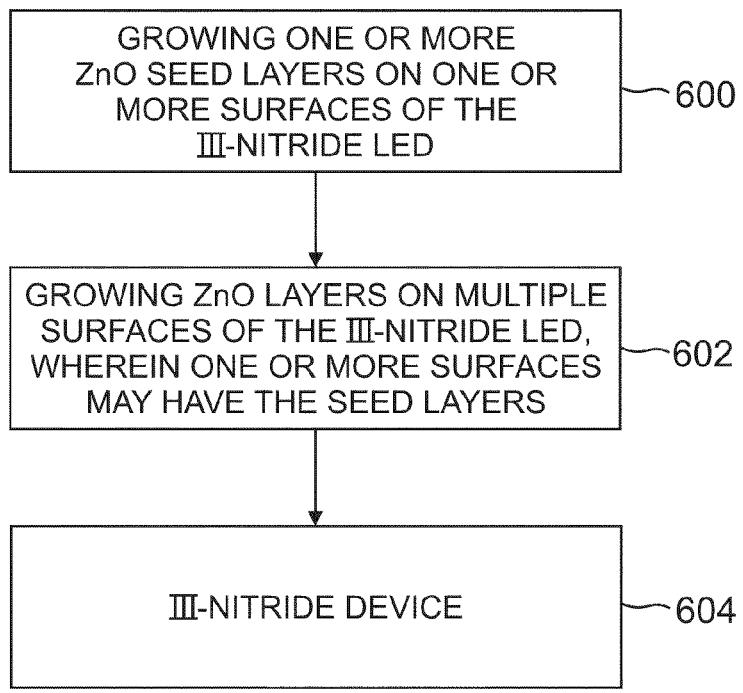
FIG. 6 is a flowchart illustrating a method of fabricating ZnO layers on multiple surfaces of a III-Nitride LED, according to another embodiment of the present invention.

In other embodiments, the growing of Block 500 occurs in two steps, as represented by FIG. 6.

Block 600 represents growing or depositing ZnO seed layers (e.g., thin seed layers) on one or more of the multiple surfaces. The ZnO seed layers be either epitaxial or polycrystalline (non-epitaxial) seed layers. The deposition of the seed layer may include depositing a solution comprising a Zn(II) precursor, dissolved in a solvent, to create a precursor film, and then heating the precursor film to pyrolize the Zn(II) precursor and crystallize the ZnO seed layer.

Block 602 represents growing the ZnO layers on multiple surfaces of a III-Nitride LED, wherein one or more layers may be grown by growing a ZnO seed layers into thicker ZnO layer. The step may include conversion of the thin seed layer into a thicker ZnO layer by growing in the aqueous solution, wherein the ZnO layers include the seed layer and the thicker ZnO layer. The conditions used for the deposition of the Zn(II) precursor film, or for the conversion of the Zn(II) precursor film into a crystalline ZnO layer, may be used to control the crystal orientation or texture, thickness, or surface morphology of final ZnO layers.

Block 604 represents the end result of the method, a device such as an optoelectronic device comprising a high brightness III-Nitride based LED, wherein multiple surfaces of the LED are covered by one or more ZnO layers. The ZnO layers may comprise a ZnO film, e.g. an epitaxial ZnO film or a polycrystalline film (non-epitaxial), on the III-Nitride LED.

Non-Epitaxial Seed Layer Deposition

ZnO films with preferential c-direction orientation can be formed on any arbitrary surface of an LED using a two step process. First, a thin polycrystalline ZnO seed layer may be deposited on the surfaces (Block 600). In one embodiment, a solution based, ZnO precursor decomposition method is used to accomplish this. A Zn(II) salt or other Zn(II) precursor is dissolved in suitable solvent along with any other additives for modifying the characteristics of the solution. For the experimental results shown here, Zn(II) Acetate dehydrate was dissolved in ethanol at a concentration of 0.5 mol/L along with 0.5 mol/L diethanolamine. The addition of diethanolamine serves to increase the solubility of Zn in solution, as well modify the viscosity and drying behavior of the solution. The precursor solution is then deposited on the desired surfaces of the LED by a chemical solution deposition method such as spin coating, dip coating, or spray coating. The resulting film is then annealed, either first at an intermediate temperature to pyrolyze the film, followed by a higher temperature crystallize the film, or immediately at a temperature high enough to both pyrolyze the precursor and crystalline ZnO. The deposition of precursor solution can be repeated, before or after the pyrolysis or crystallization steps to give greater seed layer thickness. Variations in the conditions used will alter the properties of the resulting film. For the results presented in FIG. 6, the precursor solution was spin-coated onto the LED followed by a rapid thermal annealing treatment to 600° C. in an $N_2/O_2$ atmosphere to both pyrolyze and crystallize the precursor film into a ZnO seed layer.

Epitaxial Seed Layer Deposition

For LEDs which have surfaces displaying one or more crystallographic orientations of a Wurtzite III-Nitride, it is possible to deposit epitaxial ZnO layers. Growth of epitaxial ZnO on III-Nitride can be accomplished using aqueous solution routes, as described by Thompson et al [11] and Kim et al [7]. Although these reports dealt with only the (0001) orientation of GaN, the same procedure may be used for other GaN surfaces. These reports utilize a two step approach to grow thick coalesced ZnO films. The first step serves to form a high density of epitaxial ZnO nuclei on the GaN surface (Block 400). In practice, this is accomplished by preheating an aqueous solution of zinc nitrate and ammonium nitrate to 90° C., and then adding aqueous ammonia to raise the pH. Richardson and Lange [8] describe how this procedure rapidly increases the supersaturation of ZnO in solution, supplying the high driving force needed to create a high density of ZnO nuclei. In this case, the required supersaturation was created by rapidly increasing the pH of the solution, however, a large supersaturation can also be created by changing other conditions. Of particular importance, Richardson and Lange [8] also show that under certain solution conditions it is possible to create a supersaturation by heating the solution. The specific conditions used to nucleate ZnO on GaN will affect the properties of the ZnO layer produced. For best results the conditions should lead to a high density of nuclei while minimizing non epitaxial nucleation. Epitaxial nucleation is energetically favorable, but excessively high supersaturations can lead to non-epitaxial nucleation. The supersaturation event leading to nucleation should also be transitory, as a continuous high supersaturation can lead to unfavorable secondary nucleation.

Aqueous Conversion of ZnO Seed Layers to Thicker ZnO Films

After the seed layer deposition of Block 600, a second step (Block 602) is typically used to grow the ZnO seed layer into a thicker film. This is accomplished using growth from an aqueous solution. Growth of ZnO from aqueous solution is well known, and many different specific solution conditions can be used for this purpose. The specific solution conditions used will, along with the properties of the seed layer, determine the final properties of the ZnO film. The growth solution may contain a Zn(II) source such as a salt or another Zn containing material that can be dissolved to appreciable concentrations. Typically, the solution will also contain other chemicals which serve to complex Zn, modify the pH of the solution, and/or interact with the surface of the growing ZnO crystals. For ZnO to deposit from a stable solution, growth may be initiated by some change in the solution conditions. For example, this can be achieved with a change in the pressure, pH, temperature, or the concentrations of one or more of the solution components. The results shown in this disclosure were obtained using the second step of the procedure reported by Thompson et al [11]. In this procedure, ZnO forms after a stable room temperature solution containing Zn nitrate and ammonia is heated to 90° C. In some cases, sodium citrate is also added to the growth solution. The citrate anions, provided by the addition of sodium citrate, slow the growth in the c-direction and encourage a ZnO morphology with more exposed c-plane surfaces see [9-11]. In the case of non-epitaxial seed layers, otherwise similar growth conditions would result in ZnO nanorod arrays without the presence of citrate in the growth solution. Other additives may be able to modify the growth in a similar way. For the growth of epitaxial ZnO, the specific orientations being grown will determine if citrate ions, or other additives, are beneficial or not.

During the conversion of the ZnO seed layers into thicker films, all growth should occur on the preexisting seed layer. To achieve this, the supersaturation in solution must be maintained at levels that are high enough to lead to appreciable ZnO growth, but low enough to minimize new nucleation. In some cases it may be possible to reach this intermediate level of supersaturation after an initial period of higher supersaturation. In principle, a procedure that accomplished this would allow the nucleation of the seed layer and the subsequent growth into a thicker film to be achieved in a single growth step.

Figure 7:
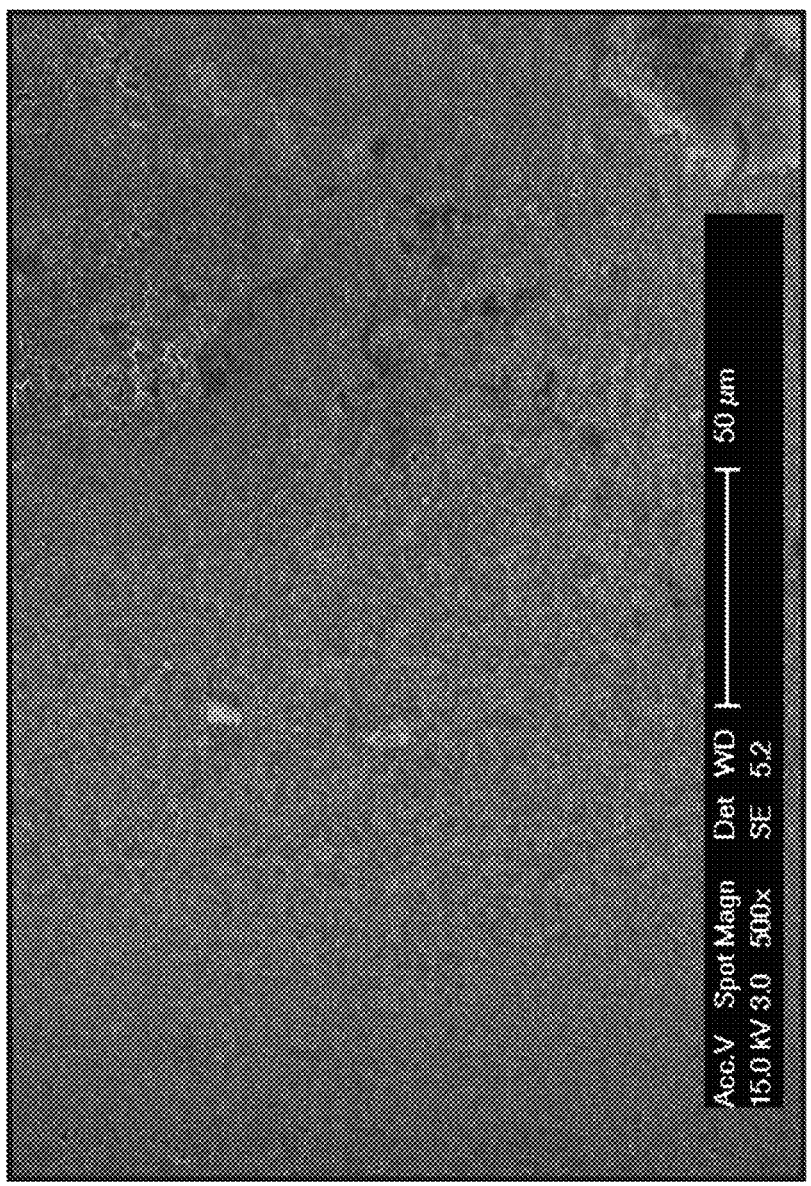
FIG. 7 shows a scanning electron microscope image of a polycrystalline ZnO film, with a preferred c-direction surface normal orientation that has been grown on a non-polar surface of a bulk GaN substrate.

FIG. 7 shows a scanning electron microscope image of a polycrystalline ZnO film, with a preferred c-direction surface normal orientation that has been grown on a non-polar surface of a bulk GaN substrate.

REFERENCES

The following references are incorporated by reference herein.

[1] T. Margalith, O. Buchinsky, D. A. Cohen, A. C. Abare, M. Hansen, S. P. DenBaars and L. A. Coldren: Appl. Phys. Lett. 74 (1999) 3930.

[2] K.-M. Chang, J.-Y. Chu and C.-C. Cheng: Solid-State Electron. 49 (2005) 1381.

[3] K. Nakahara, K. Tanuma, M. Sakai, D. Nakagawa, N. Ito, M. Sonobe, H. Takasu, H. Tampo, P. Fons, K. Matsubara, K. Iwata, A. Yamada and S. Niki: Jpn. J. Appl. Phys. 43 (2004) L180.

[4] J. O. Song, K.-K. Kim, S.-J. Park and T.-Y. Seong: Appl. Phys. Lett. 83 (2003) 479.

[5] R. H. Horng, C. C. Yang, J. Y. Wu, S. H. Huang, C. E. Lee, and D. S. Wuu: Appl. Phys. Lett. 86, 221101 (2005).

[6] Jinn-Kong Sheu, Y. S. Lu, Min-Lum Lee, W. C. Lai, C. H. Kuo and Chun-Ju Tun: Appl. Phys. Lett. 90, 263511 (2007).

[7] J. H. Kim, E. M. Kim, D. Andeen, D. Thompson, S. P. DeBaars, F. F. Lange, Adv. Funct. Mater. 17, 463 (2007).

[8] J. J. Richardson, F. F. Lange, Cryst. Growth & Design 9, 6, 2570 (2009)

[9] D. Andeen, J. H. Kim, F. F. Lange, G. K. L. Goh, S. Tripathy: Advanced Functional Materials 16, 799 (2006).

[10] Z. R. R. Tian, J. A. Voigt, J. Liu, B. McKenzie, M. J. McDermott, M. A. Rodriguez, H. Konishi, H. F. Xu: Nature Materials 2, 12, 821 (2003).

[11] Daniel B. Thompson, Jacob J. Richardson, Steven P. DenBaars, and Frederick F. Lange, entitled "Light Emitting Diodes with ZnO Current Spreading Layers Deposited from a Low Temperature Aqueous Solution," Applied Physics Express 2 (2009) 042101, published online on Mar. 19, 2009.

[12] Presentation Slides given by Jacob Richardson, entitled "Low Temperature Aqueous Deposition of ZnO on GaN LEDs," at the 2009 Annual Review for the Solid State Lighting and Energy Center (SSLEC), University of California, Santa Barbara (Nov. 5, 2009).

[13] U.S. Utility patent application Ser. No. 12/761,246, filed on Apr. 15, 2010, by Jacob J. Richardson and Frederick F. Lange, entitled "LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS,".

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating a III-Nitride based Light Emitting Diode (LED) with improved light extraction efficiency, comprising:

growing one or more Zinc Oxide (ZnO) layers on one or more non-polar or semi-polar III-nitride light transmitting surfaces of a III-Nitride based LED, from an aqueous solution containing dissolved Zn(II) and by means of a chemical reaction involving the dissolved Zn(II), wherein conditions during the growing control crystal orientation of the ZnO layers such that the ZnO layers form on the light transmitting surfaces in contact with the aqueous solution and are non-epitaxial with respect to the underlying non-polar or semi-polar III-nitride light transmitting surface.

2. The method of claim 1, wherein a maximum temperature of the aqueous solution is less than a boiling point of the aqueous solution.

3. The method of claim 1, wherein the dissolved Zn(II) in the aqueous solution is supplied by dissolving a water soluble salt of Zn(II).

4. The method of claim 1, wherein the dissolved Zn(II) in the aqueous solution is supplied by dissolving ZnO.

5. The method of claim 1, wherein the aqueous solution is a growth solution, and the growing of the ZnO layers is performed in one or more steps, such that, in any one or more of the steps, the reaction of the dissolved Zn(II) to form the ZnO layers is caused, intensified, or otherwise controlled by an increase in a temperature of the growth solution, or by a change in a pH of the growth solution, or by an increase in temperature of the growth solution and a change in pH of the growth solution.

6. The method of claim 1, wherein a morphology of the ZnO layers produced is modified by an addition of additives to the aqueous solution, wherein the additives include one or more of the following: metal citrate salts, citric acid, surfactants, polymers, biomolecules, or other molecules that interact with a surface of ZnO or the ZnO layers.

7. The method of claim 1, wherein one or more of the ZnO layers are grown with a two-step process, wherein a first step of the two-step process includes deposition of a seed layer, and a second step of the two-step process includes conversion of the seed layer into a thicker ZnO layer by growing in the aqueous solution, wherein the ZnO layers include the seed layer and the thicker ZnO layer.

8. The method of claim 7, wherein the deposition of the seed layer is by depositing a solution comprising a Zn(II) precursor, dissolved in a solvent, to create a precursor film, and then heating the precursor film to pyrolize the Zn(II) precursor and crystallize the ZnO seed layer.

9. The method of claim 1, further comprising controlling a morphology of the ZnO layers by creating one or more roughened, patterned, or structured surfaces of the ZnO layers that are suitable for enhancing the light extraction of light emitted by the LED.

10. The method of claim 9, wherein the roughened, patterned, or structured surfaces of the ZnO layers are created during the step of synthesizing the ZnO layers.

11. The method of claim 9, wherein the creation of the roughened, patterned, or structured surfaces is created by one or more steps involving removal of material from the pre-formed ZnO layers by means of physical or chemical etching.

12. The method of claim 1, further comprising selecting conditions wherein:
   one or more of the ZnO layers include one or more epitaxial ZnO layers covering on at least one of non-polar or semi-polar III-Nitride light transmitting surfaces, and
   one or more of the ZnO layers include one or more polycrystalline ZnO layers, on at least one of the non-polar or semi-polar III-nitride light transmitting surfaces, with a preferential crystalline grain texture such that, on average, ZnO crystals in the polycrystalline ZnO layers are oriented with their [0001] c-direction perpendicular to the covered light transmitting surfaces.

13. The method of claim 1, wherein the III-Nitride LED is a grown on a bulk Gallium Nitride (GaN) substrate.

14. The method of claim 1, wherein the LED further comprises:
   a III-nitride n-type layer;
   a III-nitride p-type layer;
   a III-nitride active layer, for emitting light, between the n-type layer and the p-type layer, wherein:
   (1) a plurality of the light transmitting surfaces, wherein the light transmitting surfaces include a bottom surface of the LED, sidewalls of the LED, and a top surface of the LED, and
   (2) at least one of the ZnO layers is on each of the light transmitting surfaces and the ZnO layers increase light extraction from the LED.

15. The method of claim 1, wherein the LED is a non-polar III-nitride LED.

16. The method of claim 1, wherein the LED is a semi-polar III-nitride LED.

17. The method of claim 1, wherein the epitaxial ZnO layers include a current spreading layer.

18. A method of fabricating a III-Nitride based Light Emitting Diode (LED) with improved light extraction efficiency, comprising:
   growing one or more Zinc Oxide (ZnO) layers from an aqueous solution on one or more non-polar or semi-polar III-nitride light transmitting surfaces of a III-Nitride based LED, wherein:
   conditions during the growing control crystal orientation of the ZnO layers such that the ZnO layers are epitaxial or non-epitaxial with respect to underlying non-polar or semi-polar III-nitride light transmitting surface, and one or more of the ZnO layers include one or more polycrystalline ZnO layers, on at least one of the non-polar or semi-polar III-nitride light transmitting surfaces, with a preferential crystalline grain texture such that, on average, ZnO crystals in the polycrystalline ZnO layers are oriented with their [0001] c-direction perpendicular to the underlying non-polar or semi-polar III-nitride surface.

19. The method of claim 18, wherein one or more of the polycrystalline ZnO layers are roughened in a way that increases light extraction from the LED.

20. The method of claim 18, wherein the ZnO layers are epitaxially grown on one or more of the light transmitting non-polar or semi-polar III-Nitride surfaces of the LED.

21. A method of fabricating a III-Nitride based Light Emitting Diode (LED) with improved light extraction efficiency, comprising:
   growing one or more Zinc Oxide (ZnO) layers from an aqueous solution on one or more non-polar or semi-polar III-nitride lighttransmitting surfaces of a III-Nitride based LED, wherein:
   conditions during the growing control crystal orientation of the ZnO layers such that the ZnO layers are epitaxial or non-epitaxial with respect to the underlying non-polar or semi-polar III-nitride light transmitting surface, and the ZnO layers include an epitaxial ZnO film and a non-epitaxial ZnO film.

22. The method of claim 21, further comprising growing the ZnO layers from the aqueous solution containing dissolved Zn(II), by means of a chemical reaction involving dissolved Zn(II), wherein:
   the ZnO layers form on the light transmitting surfaces in contact with the aqueous solution,
   the reaction of the dissolved Zn(II) to form the ZnO layers is caused, intensified, or otherwise controlled by an increase in a temperature of the growth solution or by a change in a pH of the growth solution, or by an increase in temperature of the growth solution and a change in pH of the growth solution,
   one or more of the ZnO layers are grown with a two-step process, wherein a first step of the two-step process includes deposition of a seed layer and a second step of the two-step process includes conversion of the seed layer into a thicker ZnO layer by growing in the aqueous solution, wherein the ZnO layers include the seed layer and the thicker ZnO layer, and
   the deposition of the seed layer is by depositing a solution comprising a Zn(II) precursor, dissolved in a solvent, to create a precursor film, and then heating the precursor film to pyrolize the Zn(II) precursor and crystallize the ZnO seed layer.

* * * * *